United States Patent
Yuki et al.

(10) Patent No.: US 6,756,278 B2
(45) Date of Patent: Jun. 29, 2004

(54) LATERAL HETEROJUNCTION BIPOLAR TRANSISTOR AND METHOD OF FABRICATING THE SAME

(75) Inventors: Koichiro Yuki, Moriguchi (JP); Minoru Kubo, Mie (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 75 days.

(21) Appl. No.: 10/269,079

(22) Filed: Oct. 11, 2002

(65) Prior Publication Data

US 2003/0054601 A1 Mar. 20, 2003

Related U.S. Application Data

(62) Division of application No. 09/692,215, filed on Oct. 20, 2000, now Pat. No. 6,563,146.

(30) Foreign Application Priority Data

Oct. 21, 1999 (JP) .......................................... 11-299643

(51) Int. Cl.[7] .............................................. H01L 21/331
(52) U.S. Cl. ...................................... 438/309; 257/197
(58) Field of Search ................................ 438/235, 309, 438/316–317, 312, 325, 335, 343, 348; 257/197

(56) References Cited

U.S. PATENT DOCUMENTS

| | | | |
|---|---|---|---|
| 5,510,647 A | 4/1996 | Nakajima et al. | |
| 5,548,156 A | 8/1996 | Miwa et al. | |
| 5,665,614 A | * 9/1997 | Hafizi et al. | 438/320 |
| 5,780,880 A | * 7/1998 | Enquist | 257/197 |
| 5,834,800 A | 11/1998 | Jalali-Farahani et al. | |

FOREIGN PATENT DOCUMENTS

| | | |
|---|---|---|
| EP | 0 616 370 A2 A3 | 9/1994 |
| JP | 5-90284 | 4/1993 |
| JP | 11-307541 | 11/1999 |

OTHER PUBLICATIONS

T. Shino et al., "A 31 GHzf$_{max}$ Lateral BJT on SOI Using Self–Aligned External Base Formatting Technology", 1998 IEEE, 4 sheets (No page numbers appeared), 1998.
XP008016052, "M. I. Alonso et al.,", "Heteroepitaxy and Seeded Lateral Overgrowth on Silicon Substrates by Liquid Phase Epitaxy", pp. 313–320, Oct. 20, 1987.

* cited by examiner

Primary Examiner—David Nelms
Assistant Examiner—David Vu
(74) Attorney, Agent, or Firm—McDermott, Will & Emery

(57) ABSTRACT

A lateral heterojunction bipolar transistor comprises a first semiconductor layer in a mesa configuration disposed on an insulating layer, a second semiconductor layer formed by epitaxial growth on the side surfaces of the first semiconductor layer and having a band gap different from that of the first semiconductor layer, and a third semiconductor layer formed by epitaxial growth on the side surfaces of the second semiconductor layer and having a band gap different from that of the second semiconductor layer. The first semiconductor layer serves as a collector of a first conductivity type. At least a part of the second semiconductor layer serves as an internal base layer of a second conductivity type. At least a part of the third semiconductor layer serves as an emitter operating region of the first conductivity type. The diffusion of an impurity is suppressed in the internal base formed by epitaxial growth.

12 Claims, 11 Drawing Sheets

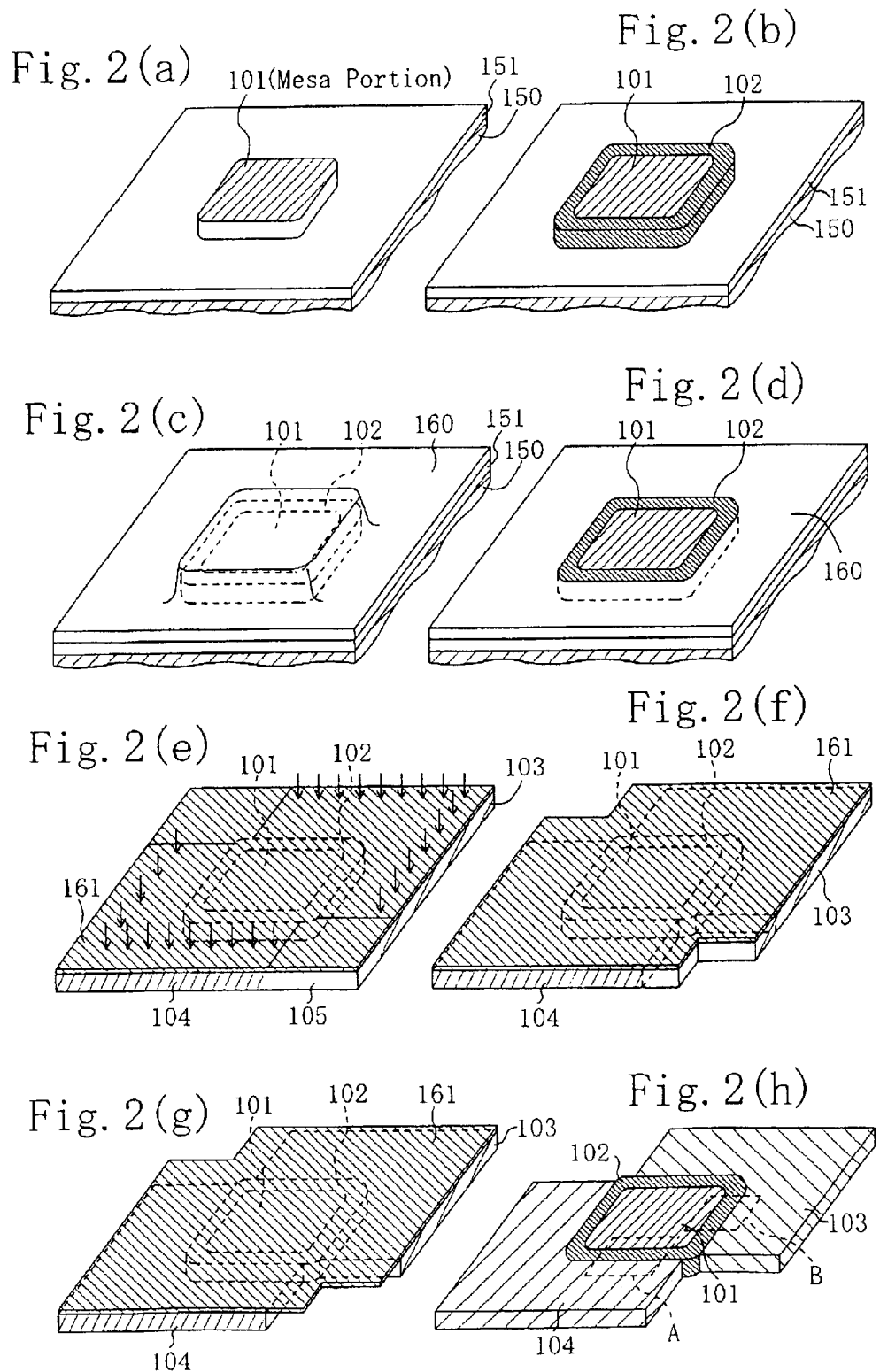

Implantation for p+diffusion region.

SIN mask patterning by side etching.

Link region formed by the self-aligned process.

Implantation for internal base region.

Implantation for emitter and n+collector region.

LATERAL HETEROJUNCTION BIPOLAR TRANSISTOR AND METHOD OF FABRICATING THE SAME

This application is a Divisional of 09/692,215 filed on Oct. 20, 2000 now U.S. Pat. No. 6,563,146

BACKGROUND OF THE INVENTION

The present invention relates to a lateral heterojunction bipolar transistor and to a method of fabricating the same. More particularly, it relates to a lateral heterojunction bipolar transistor having a heterostructure such as $Si/Si_{1-x}Ge_x$ or $Si/Si_{1-x-y}Ge_xC_y$ formed on an insulating substrate such as SOI (Silicon on Insulator).

There has conventionally been proposed technology for providing a transistor with excellent characteristics by forming a CMOS device and a bipolar transistor on a SOI (Silicon on Insulator) substrate composed of a silicon layer stacked on an insulating layer to lower the operating voltage of the transistor, provide a complete isolation between devices, and reduce a parasitic capacitance. In transmitting/receiving portions of a communication device handling an RF signal, in particular, a crosstalk between an analog circuit and a digital circuit presents a problem. However, the use of the SOI substrate holds promise of removing the crosstalk more drastically than the conventional technology.

On the other hand, a heterojunction bipolar transistor using a heterostructure such as Si/SiGe has been used commercially in recent years as a device operable in a region of RF frequencies, which has been considered difficult to fabricate by using the technology using a silicon process. Compared with a Si homojunction bipolar transistor, the heterojunction bipolar transistor has an excellent characteristic such that the resistance of a base can be reduced by adjusting the impurity concentration in the base to be higher than in the Si homojunction bipolar transistor since reverse injection of carriers from the base to an emitter is suppressed by using the heterostructure in which the band gap of the base is smaller than the band gap of the emitter.

In response to the system-on-chip demand made in recent years, BiCMOS technology has been requested to form a CMOS device and a bipolar transistor on a single chip. To form the bipolar transistor on a SOI substrate, however, it is necessary to increase the thickness of a silicon layer to a certain degree in a conventional vertical bipolar transistor structure, while it is necessary to reduce the thickness of the silicon layer in the CMOS device for high-speed operation and the suppression of a leakage current. However, the provision of a silicon layer having different thicknesses in a CMOS device region and a bipolar transistor region increases the complexity of the fabrication process.

To use a silicon layer having the same thickness in the bipolar transistor region as in the CMOS device region, there has been proposed the formation of a lateral heterojunction bipolar transistor on a SOI substrate. By using a lateral heterojunction bipolar transistor structure, the silicon layer having the same thickness in the both regions can be used and the process steps are greatly reduced in number. It has also been reported that a parasitic resistance is smaller in the lateral heterojunction bipolar transistor structure than in the vertical bipolar transistor formed by using a SOI substrate, which is advantageous in terms of high-speed operation.

FIGS. 10(a) and 10(b) are a plan view and a cross-sectional view of a lateral heterojunction bipolar transistor provided on a SOI disclosed in a document about an example of a prototype of such a lateral heterojunction bipolar transistor (A 31 GHz $f_{max}$ Lateral BJT on SOI Using Self-Aligned External Base Formation Technology: T. Shino et. al. 1998 IEEE). As shown in the drawings, the lateral heterojunction bipolar transistor is formed on a SOI substrate including a BOX layer 1001 composed of a silicon oxide film and a silicon layer 1009. By using the SOI substrate, a parasitic capacitance in the operating region of the transistor can be reduced. The thickness of the silicon layer 1009 is 0.1 μm. The silicon layer 1009 comprises: a strip-like p-type internal base layer 1004 doped with boron (B); two external base layers 1006 connected to the shorter side portions on both ends of the internal base layer 1004 and doped with boron (B) at a concentration higher than that in the internal base layer 1004; and an n-type emitter 1005 and an n-type collector 1002 disposed with the longer side portions of the internal base layer 1004 interposed therebetween. The emitter 1005 has been doped with arsenic (As) at a high concentration and the collector 1002 has been doped with arsenic at a non-uniform concentration. In short, the collector 1002 has a retrograde structure in which the concentration of arsenic is lower for an increased breakdown voltage in the portions thereof closer to the internal base layer 1004 and the external base layers 1006, which increases gradually with distance from the internal base layer 1004 and the external base layers 1006. The respective electrode formation portions of the external base layers 1006, the emitter 1005, and the collector 1002 are located on the respective outward tips of the regions such that the longest possible distances are provided therebetween and that parasitic capacitances among base electrodes, an emitter electrode, and a collector electrode are reduced. The foregoing document reports that such a lateral heterojunction bipolar transistor has provided a maximum oscillation frequency fmax of 31 GHz.

FIGS. 11(a) to 11(e) are perspective views illustrating a method of fabricating the bipolar transistor disclosed in the document.

First, in the step shown in FIG. 11(a), an oxide film and a SiN film (not shown) are formed on the n-type silicon layer 1009 into which phosphorus (P) has been introduced. Then, an array-like resist mask 1108 is formed on the SiN to cover an NPN active region. Subsequently, boron (B) is ion implanted at a dose of $4 \times 10^{15}$ atoms·cm$^{-2}$ into the silicon layer 1009 except for the NPN active region 1107 from above the resist mask 1108, whereby a P$^+$ diffused region is formed. Next, in the step shown in FIG. 11(b), the SiN film is patterned by using the resist mask 1108 as a mask and side etched to form a SiN mask 1110, which is inwardly offset by about 0.2 μm from the ends of the resist mask 1108. Thereafter, the resist mask 1108 is removed. Then, in the step shown in FIG. 11(c), a TEOS mask 1111 is formed in crossing relation to the SiN mask 1110. Subsequently, boron (B) is ion implanted at a dose of $1 \times 10^{14}$ atoms·cm$^{-2}$ and an acceleration energy of 25 keV into the silicon layer 1009 except for the region covered with the SiN mask 1110 and the TEOS mask 1111. Next, in the step shown in FIG. 11(d), the SiN mask 1110 and the TEOS mask 1111 are removed. At this time, the width of the internal base layer 1004 is determined by the diffusion distance traveled by implanted boron, which is measured from the end portion of the TEOS mask 1111. Finally, in the step shown in FIG. 11(e), portions serving as the emitter and the collector are mesa etched and arsenic (As) is ion implanted into the respective portions at a dose of $1 \times 10^{15}$ atoms·cm$^{-2}$ and an acceleration voltage of 120 keV and at a dose of $1 \times 10^{15}$ atoms·cm$^{-2}$ and an acceleration voltage of 65 keV. Since the silicon layer 1009 is amorphized by the ion implantations, it is recrystallized by RTA performed at 1050° C. for 20 sec and by electric furnace annealing performed at 850° C. for 60 sec.

By the foregoing process, a lateral bipolar transistor with a small parasitic capacitance which is high in fmax and operable at a high speed can be formed.

However, since the width of the internal base 1104 is determined by the diffusion distance of boron in accordance with the prior art technology disclosed in the foregoing document, it is difficult to constantly obtain a desired impurity distribution. Since the range in which the emitter 1105 and the collector 1102 are formed is determined by the diffusion distance of the n-type impurity, it is also difficult to form a pn junction with a sharp impurity concentration distribution.

SUMMARY OF THE INVENTION

It is therefore an object of the present invention to provide, during the formation of a lateral heterojunction bipolar transistor on a SOI substrate, means for accurately adjusting the width of an internal base layer or the like to a desired dimension and thereby provide a lateral heterojunction bipolar transistor having stable characteristics and a fabrication method therefor.

A first lateral heterojunction bipolar transistor comprises: a substrate having an insulating layer; a first semiconductor layer in a mesa configuration disposed on the insulating layer; a second semiconductor layer formed by epitaxial growth on a side surface of the first semiconductor layer, the second semiconductor layer having a band gap different from a band gap of the first semiconductor layer; and a third semiconductor layer formed by epitaxial growth on a side surface of the second semiconductor layer, the third semiconductor layer having a band gap different from the band gap of the second semiconductor layer, at least a part of the second semiconductor layer functioning as an internal base layer of a second conductivity type.

In the arrangement, the lateral thickness of the second semiconductor layer serving as the internal base layer is determined by epitaxial growth, not by the implantation of impurity ions. Consequently, the lateral thickness of the internal base layer is controlled with high accuracy. Since the internal base layer is formed by epitaxial growth, not by the implantation of impurity ions, the internal base layer can be doped in situ with an impurity, while it is laterally grown. This provides a sharp impurity concentration distribution in which impurity diffusion is suppressed.

There can be adopted a structure in which least the first semiconductor layer functions as a collector of a first conductivity type and at least a part of the third semiconductor layer functions as an emitter operating region of the first conductivity type.

The first lateral heterojunction bipolar transistor further comprises an external base layer of the second conductivity type in contact with the second semiconductor layer. The arrangement allows easy formation of an electrode.

The band gap of the second semiconductor layer is smaller than the band gap of the third semiconductor layer. The arrangement suppresses reverse injection of carriers from the second semiconductor layer functioning as the internal base layer into the third semiconductor layer functioning as the emitter operating region. As a result, base resistance can be reduced by adjusting an impurity concentration in the second semiconductor layer higher than a concentration in a homojunction bipolar transistor.

Each of the first and third semiconductor layers is composed of a silicon layer and the second semiconductor layer is composed of an alloy containing at least any two of Si, Ge, and C. The arrangement allows the formation of a heterojunction bipolar transistor in which impurity diffusion is suppressed by using a silicon process.

A principal surface of the first semiconductor layer is a {110} plane and a side surface of the first semiconductor layer in contact with the second semiconductor layer is a {111} plane. The arrangement provides the first semiconductor layer with a smooth side surface by using wet etching.

A first method of fabricating a lateral heterojunction bipolar transistor comprises the steps of: (a) forming an etching mask on a semiconductor layer disposed on an insulating layer to compose a substrate; (b) patterning the semiconductor layer by etching including dry etching and using the etching mask to form a first semiconductor layer in a mesa configuration; (c) epitaxially growing, on at least one side surface of the first semiconductor layer, a second semiconductor layer having a band gap different from a band gap of the first semiconductor layer; and (d) epitaxially growing, on a side surface of the second semiconductor layer, a third semiconductor layer having a band gap different from the band gap of the second semiconductor layer, at least the first semiconductor layer functioning as a collector of a first conductivity type, at least a part of the second semiconductor layer functioning as an internal base layer of a second conductivity type, at least a part of the third semiconductor layer functioning as an emitter operating region of the first conductivity type.

In accordance with the method, the lateral thickness of the first semiconductor layer functioning as the internal base layer is determined by epitaxial growth, not by the implantation of impurity ions. Consequently, the lateral thickness of the internal base layer is controlled with high accuracy. Since the internal base layer is formed by epitaxial growth, not by the implantation of impurity ions, the internal base layer can be doped in situ with an impurity, while it is laterally grown. This provides a sharp impurity concentration diffusion in which impurity diffusion is suppressed.

The step (b) includes: patterning the semiconductor layer by dry etching into a configuration of the etching mask and; forming the first semiconductor layer by performing wet etching with respect to a side portion of the patterned semiconductor layer, while leaving the etching mask. The arrangement is preferred since it removes etching damage, while retaining a high patterning accuracy.

The first method further comprises, after the step (d), the steps of: (e) depositing a polycrystalline semiconductor film on the substrate; and (f) planarizing the polycrystalline semiconductor film by CMP to form an emitter in contact with at least the third semiconductor layer. This allows easy formation of a low-resistance emitter adjacent the emitter operating region.

The first method further comprises, in or after the step (e), the step of: (g) introducing an impurity of the first conductivity type into a first region of the polycrystalline semiconductor film and introducing an impurity of the second conductivity type into a second region of the polycrystalline semiconductor film; and removing, of the polycrystalline semiconductor film, at least a portion located between the first and second regions to form an emitter in contact with the third semiconductor layer from the first region and form an external base layer in contact with the second semiconductor layer from the second region. This allows easy formation of a low-resistance emitter and a low-resistance external base layer by using a polycrystalline film such as a polysilicon film.

Preferably, the introduction of the impurity is performed by ion implantation using a mask.

Preferably, the step (g) is performed by wet etching.

The etching mask is formed by using a semiconductor layer having a principal surface of a {110} plane as the semiconductor layer on the insulating layer in the step (a) and such that the side surface of the first semiconductor layer in contact with the second semiconductor layer is a {111} plane in the step (b). This allows the formation of an internal base layer having a uniform lateral thickness by using a {111} plane which is etched at a particularly low speed and provides a smooth flat surface.

Preferably, the step (b) includes: crystal anisotropic etching using an etching solution containing at least any one of ethylenediamine, pyrocatechol, KOH, and hydrazine.

A second lateral heterojunction bipolar transistor disposed on an insulating layer comprises: a first semiconductor layer functioning as a collector; a second semiconductor layer disposed in contact with at least one side surface of the first semiconductor layer to function as an internal base having a band gap smaller than a band gap of the first semiconductor layer; a third semiconductor layer disposed in contact with a side surface of the second semiconductor layer to function as an emitter having a band gap larger than the band gap of the second semiconductor layer; first and second electrodes in contact with respective side surfaces of the first and third semiconductor layers; and a third electrode disposed in contact with a top surface of the second semiconductor layer.

This provides a lateral heterojunction bipolar transistor having a relatively simple structure and excellent characteristics of low parasitic capacitance, low parasitic resistance, and low base resistance, which is formed on the insulating layer.

Each of the first and second electrodes is composed of a metal. This particularly lowers the resistances of the emitter and collector.

A second method of fabricating a lateral heterojunction bipolar transistor comprises the steps of: (a) introducing an impurity of a first conductivity type into a first semiconductor layer containing an impurity of the first conductivity type, the first semiconductor layer being disposed on an insulating layer to compose a substrate; (b) forming, on the first semiconductor layer, an etching mask having a slit with a width of 200 nm or less; (c) removing a portion of the semiconductor layer located under the slit by etching using the etching mask to form a groove penetrating the first semiconductor layer; (d) epitaxially growing, from both side surfaces of the groove in the first semiconductor layer, a second semiconductor layer having a band gap different from a band gap of the first semiconductor layer such that the second semiconductor layer is buried in the groove; (e) forming openings in respective regions of the insulating layer located on both sides of the slit and above the first semiconductor layer; (f) performing wet etching with respect to the first semiconductor layer from the openings in the insulating layer to form hollow portions and leave respective portions of the first semiconductor layer on both sides of the second semiconductor layer; (g) forming first and second electrodes to be buried in the respective hollow portions; and (h) forming a third electrode to be buried in the slit in the insulating film in contact relation with the second semiconductor layer, the respective portions of the first semiconductor layer left on both sides of the second semiconductor layer functioning as a collector and an emitter operating region, the second semiconductor layer functioning as an internal base layer.

The method provides a lateral heterojunction bipolar transistor having a relatively simple structure and excellent characteristics of low parasitic capacitance, low parasitic resistance, and low base resistance, which is formed on the insulating layer.

Preferably, the step (f) includes: crystal anisotropic etching using at least any one of ethylenediamine, pyrocatechol, KOH, and hydrazine.

The step (a) includes a first ion implantation for implanting impurity ions of the first conductivity into the first semiconductor layer and a second ion implantation for implanting, into a portion of the first semiconductor layer, the impurity ions at a concentration higher than in the first ion implantation, the collector is formed from a portion of the first semiconductor layer with respect to which only the first ion implantation has been performed and the second ion implantation has not been performed, and the emitter operating region is formed from the portion of the first semiconductor layer with respect to which the first and second ion implantations have been performed. This allows respective impurity concentrations in the emitter operating region and in the collector to be adjusted optimally for the operation of the bipolar transistor.

A silicon layer is used as the first semiconductor layer and an alloy containing at least any two of Si, Ge, and C is used as the second semiconductor layer. This allows the fabrication of a lateral heterojunction bipolar transistor using a silicon process.

BRIEF DESCRIPTION OF THE DRAWINGS

FIGS. 2(a) to 2(h) are cross-sectional views illustrating a method of fabricating the lateral heterojunction bipolar transistor according to the first embodiment;

DETAILED DESCRIPTION OF THE INVENTION

Embodiment 1

Figure 1A:
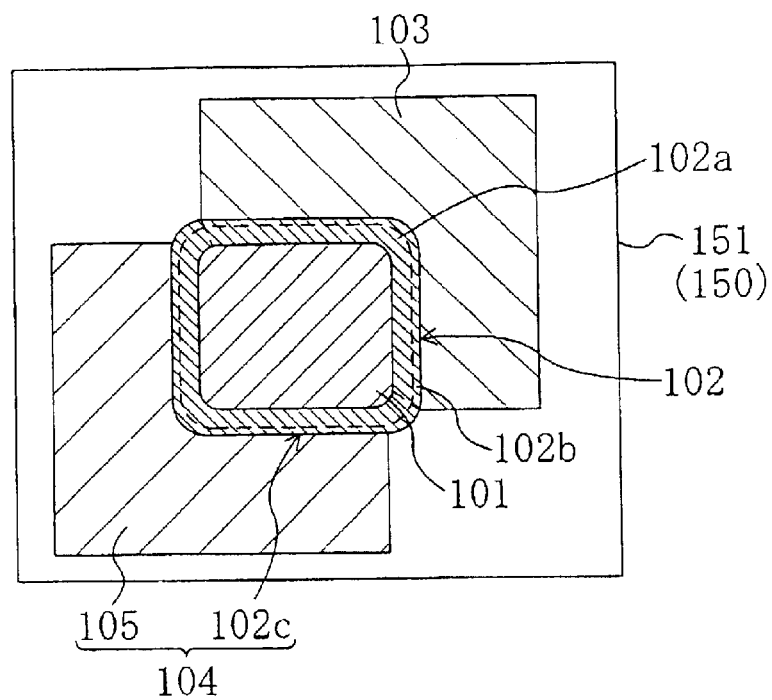
FIGS. 1(a) and 1(b) are a plan view and a perspective view of a lateral heterojunction bipolar transistor according to a first embodiment of the present invention.
Figure 1B:
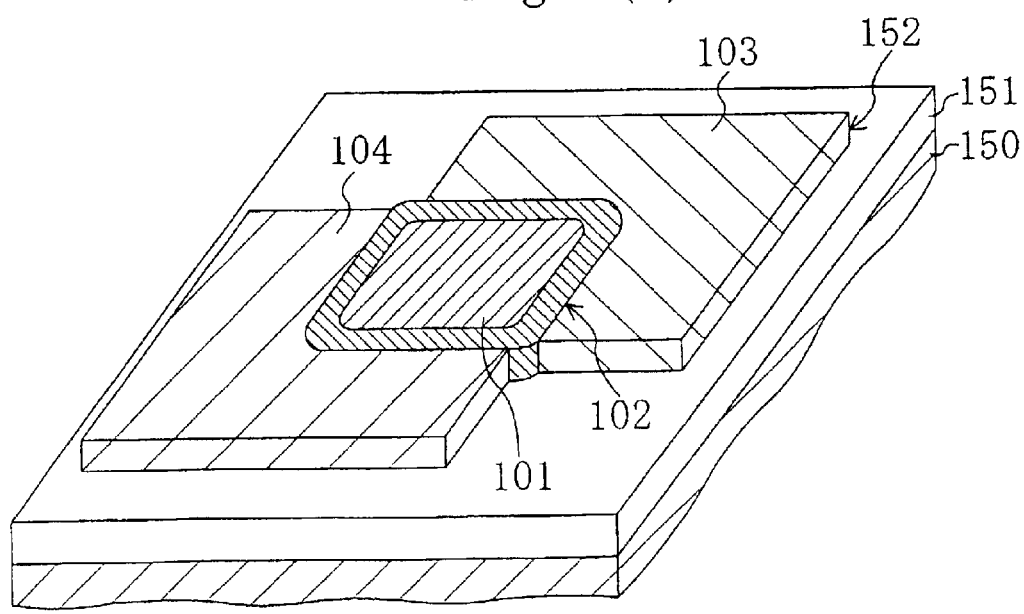

FIGS. 1(a) and 1(b) are a plan view and a perspective view of a lateral heterojunction bipolar transistor according to a first embodiment of the present invention.

As shown in FIGS. 1(a) and 1(b), the lateral heterojunction bipolar transistor according to the present embodiment has a so-called SOI structure comprising: a Si substrate 150; a BOX layer 151 composed of a silicon oxide film disposed on the Si substrate 150; and a semiconductor layer 152 disposed on the BOX layer 151. The semiconductor layer 152 comprises: a collector 101 having a generally square plan configuration and made of n-type single-crystal silicon; a SiGeC/Si layer 102 composed of a p-type SiGeC layer and an n-type Si layer each having an annular configuration surrounding the collector layer 101; an emitter 103 made of n-type polysilicon; and a p-type polysilicon layer 105. The portion of the SiGeC/Si layer 102 interposed between the collector 101 and the emitter 103 and composed of the p-type SiGeC layer (the portion internal of the broken line in the drawing) forms an internal base layer 102a and the portion of the SiGeC/Si layer 102 interposed between the collector 101 and the emitter 103 and composed of the n-type Si layer (the portion external of the broken line in the drawing forms an emitter operating region 102b. The portion 102c of the SiGeC/Si layer 102 except for the internal base layer 102a and the emitter operating region 102b and the p-type polysilicon layer 105 constitute an external base 104.

The collector 101 with a thickness of about 200 nm and sides of about 0.6 μm has been doped with antimony (Sb) (which may be phosphorous or arsenic) at a concentration of about $1 \times 10^{19}$ atoms·cm$^{-3}$. The principal surface of the collector 101 is a (110) plane and each of the side surfaces thereof is a smooth (111) plane. It is to be noted that principal surface of the collector 101 need not be a (110) plane and each of the side surfaces thereof need not be a (111) plane. Although the internal base 102a contains boron at a concentration of about $2 \times 10^{18}$ atoms·cm$^{-3}$ and is composed of a $Si_{1-x}Ge_xC_y$ layer having a graded composition in the present embodiment, the internal base 102a may also be composed of SiGe containing no C (such as $Si_{1-x}Ge_x$ or the like having a graded composition). However, the presence of C contained only in an extremely small amount achieves the particularly large effect of preventing the diffusion of the impurity. On the other hand, the emitter operating region 102b is made of single-crystal Si containing phosphorus at a concentration of about $1 \times 10^{18}$ atoms·cm$^{-3}$. The emitter 103 is made of n-type polysilicon containing phosphorus at a concentration of about $1 \times 10^{20}$ atoms·cm$^{-3}$ or more. It is to be noted that arsenic may also be used instead of phosphorus for doping. That is, a Si/SiGeC/Si heterojunction is formed among the emitter operating region, the internal base, and the collector. The external base 104 is composed of polysilicon containing boron at a concentration of about $1 \times 10^{20}$ atoms·cm$^{-3}$. The external base 104 functions as a contact region with the internal base 102a.

The collector 101 has a retrograde structure in which the concentration of the n-type impurity (antimony) increases gradually with distance from the internal base 102a. The internal base 102a has a graded composition such that the content of Ge (or Ge and C) decreases gradually with distance from the collector 101. However, the retrograde in the collector 101 and the graded composition in the internal base 102a need not necessarily be provided.

Referring to FIGS. 2(a) to 2(h), a method of fabricating the lateral heterojunction bipolar transistor according to the present embodiment will be described.

First, in the step shown in FIG. 2(a), the SOI substrate composed of the Si substrate 150, the BOX layer 151 composed of the silicon oxide film, and the Si film formed on the BOX layer 151 is formed. To form the SOI substrate, any well-known method (such as the SIMOX method) may be adopted. The present embodiment has adopted a method of bonding a silicon wafer to a silicon oxide film formed on a surface thereof and a silicon wafer such that the silicon oxide film is sandwiched between the both silicon wafers and thinning one of the silicon wafers by polishing. The Si film on the BOX layer 151 is preliminarily doped with antimony (which may be arsenic or phosphorus) at a concentration of about $1 \times 10^{19}$ atoms·cm$^{-3}$. Then, the Si film is patterned to form the square collector 101 (mesa portion) with corners rounded off. At this time, each of the side surfaces of the collector 101 can be formed to an extremely smooth (111) plane by performing wet etching using a square resist mask formed on the Si film having a principal surface of a (110) plane and having sides parallel to the <211> direction and thereby using the anisotropic property of an etch speed resulting from crystal orientation. Alternatively, the collector 101 may also be formed by forming, on the Si film, an etching mask covering the collector layer 101 and performing dry etching using the etching mask.

Next, in the step shown in FIG. 2(b), an undoped Si layer having a thickness of about 120 nm and partly composing the collector 101 is epitaxially grown on the side surfaces of the mesa portion of the collector 101 by CVD (Chemical Vapor Deposition) or by UHV-CVD (Ultra High Vacuum-CVD). During the step, antimony (Sb) is diffused from the mesa portion of the collector 101 into the Si layer in the epitaxial step, thereby forming a retrograde impurity concentration profile. Thereafter, a SiGeC layer having a lateral thickness of about 80 nm is epitaxially grown, while it is doped in situ with boron at a concentration of about $2 \times 10^{18}$ atoms·cm$^{-3}$ such that the content of C is constant (about 2%) and the content of Ge is graded as shown in FIG. 3, which will be described later. Then, an undoped Si layer having a lateral thickness of about 10 nm is formed, whereby the SiGeC/Si layer 102 is formed. Since the SiGeC layer of the SiGeC/Si layer 102 contains 2% of C, the diffusion of boron in the subsequent heat treatment step can be prevented more positively and a heterojunction portion having a sharper impurity concentration profile can be implemented.

Next, in the step shown in FIG. 2(c), a polysilicon film 160 is deposited on the substrate. Then, in the step shown in FIG. 2(d), the polysilicon film 160 is etched back and thereby planarized by a method such as CMP (Chemical Mechanical Polishing).

Next, in the step shown in FIG. 2(e), an oxide film 161 is formed on the substrate. Subsequently, boron ions are implanted into the portion of the polysilicon film 160 serving as the external base 104 such that the concentration of boron is about $1 \times 10^{20}$ atoms·cm$^{-3}$ or more, while the portion of the oxide film 161 serving as the emitter 103 is doped with phosphorus (which may be arsenic or antimony) ions such that the concentration of phosphorus is about $1 \times 10^{20}$ atoms·cm$^{-3}$ or more. It is to be noted that the Si substrate 150 and the BOX layer 151 are not depicted in the drawings showing the steps subsequent to the step shown in FIG. 2(e).

Next, since a leakage current may flow between the external base 104 and the emitter 103 via the undoped portion of the polysilicon film 160 in the current configuration, the polysilicon layer 160 is partially removed by the following process such that the external base 104 and the emitter 103 are electrically insulated from each other. Specifically, in the step shown in FIG. 2(f), an opening is formed in the portion of the oxide film 161 at a specified distance from the portion of the polysilicon film 160 into which the impurity ions have been implanted. Then, in the step shown in FIG. 2(g), the polysilicon film 160 is etched by wet etching till the SiGeC/Si layer 102 is reached. In this case, an etching solution having a high etching selectivity between polysilicon and Si is used, whereby insulation is provided without damaging the SiGeC/Si layer 102. Thereafter, a heat treatment (annealing) for activating the implanted impurity ions is performed. By the heat treatment, the n-type impurity such as phosphorus implanted in the polysilicon of the emitter 103 is diffused into the undoped silicon of the emitter operating region 102b, so that the emitter operating region 102b functions as the emitter region of the npn bipolar transistor.

Next, in the step shown in FIG. 2(h), the oxide film 161 is removed, whereby the lateral heterojunction bipolar transistor having the structure shown in FIG. 1(b) is obtained.

Figure 3A:
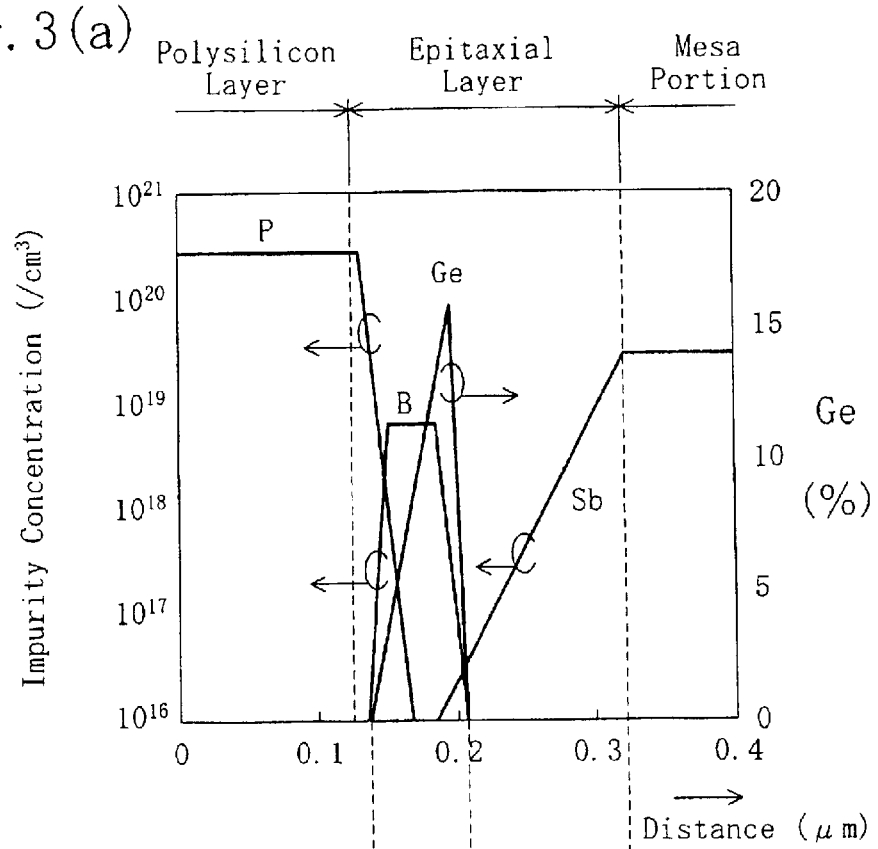
FIGS. 3(a) and 3(b) illustrate a lateral impurity profile in the region A shown in FIG. 2(h) of the lateral heterojunction bipolar transistor according to the first embodiment.
Figure 3B:
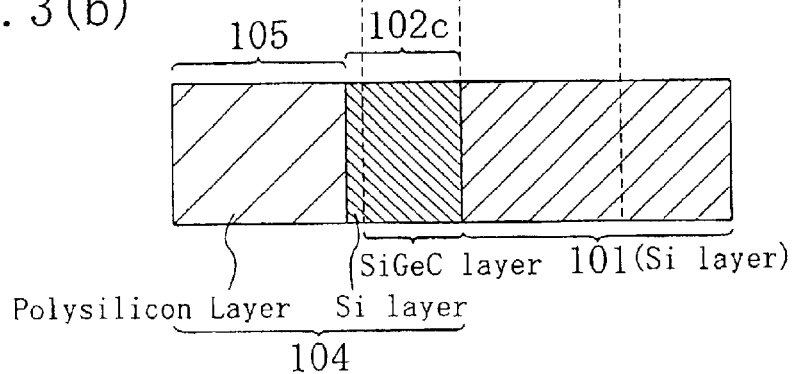
Figure 4A:
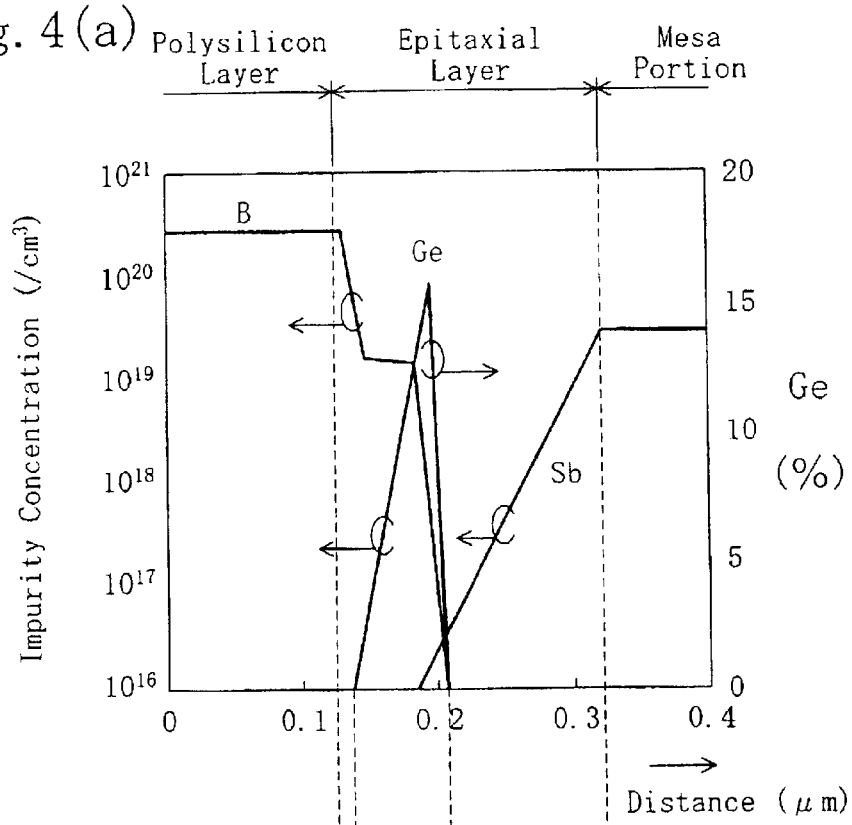
FIGS. 4(a) and 4(b) illustrate a lateral impurity profile in the region B shown in FIG. 2(h) of the lateral heterojunction bipolar transistor according to the first embodiment.
Figure 4B:
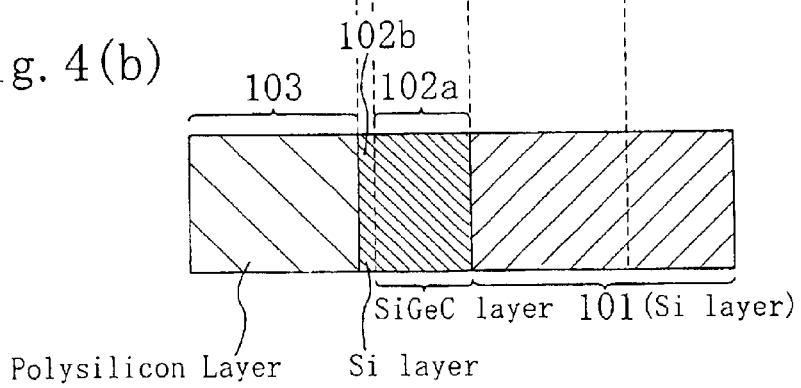

FIGS. 3(a) and 3(b) illustrate a lateral impurity profile in the region A shown in FIG. 2(h) of the lateral heterojunction bipolar transistor according to the present embodiment. FIGS. 4(a) and 4(b) illustrate a lateral impurity profile in the region B shown in FIG. 2(h) of the lateral heterobipolar transistor according to the present embodiment.

As shown in FIGS. 3(a) and 3(b) and FIGS. 4(a) and 4(b), a retrograde distribution has been formed in the collector 101, in which the concentration of Sb as the impurity increases gradually with distance from the internal base 102a to provide a higher breakdown voltage. The content of Ge in the internal base 102a is graded such that a drift electric field is generated. Although phosphorus in the emitter 103 composed of polysilicon is constantly at a high concentration of about $5 \times 10^{20}$ atoms·cm$^{-3}$, it has been diffused into the internal base 102a. The concentration after the diffusion is preferably minimized. Although the external base 104 has been doped with boron at a high concentration, the external base 104 is electrically integrated with the internal base 102a and held at substantially the same potential as the internal base 102a, since the external base 104 has been doped with the impurity of the same polarity as the internal base 102a.

Since the present embodiment has determined the lateral thickness of the internal base layer 102a by epitaxial growth by in-situ doping, not by the implantation of impurity ions, the lateral thickness of the internal base layer 102a is not dependent on the accuracy of photolithography or on the degree of impurity diffusion. Since the internal base layer 102a is formed by epitaxial growth by in-situ doping, not by the implantation of impurity ions, the diffusion of the impurity is suppressed and a relatively sharp impurity concentration distribution is obtained. In addition, since the internal base layer 102a is composed of the SiGeC layer in the present embodiment, the diffusion of the impurity in the heat treatment step is suppressed by the presence of C and the impurity concentration profile is maintained without being deformed. Even if the internal base layer 102a is composed of a SiGe layer instead of the SiGeC layer, the effect of properly maintaining the impurity concentration profile is achieved to a certain degree, since the speed at which the impurity is diffused in the SiGe layer is lower than the speed at which the impurity is diffused in the Si layer.

Moreover, since the lateral heterojunction bipolar transistor of the present embodiment uses the SiGeC/Si heterojunction, it can achieve the following effect by contrast to the lateral heterojunction bipolar transistor using the Si homojunction disclosed in the foregoing document. That is, since the band gap of the internal base layer is smaller than the band gap of the emitter operating region, reverse injection of carriers from the internal base layer into the emitter operating region is suppressed. As a result, it becomes possible to reduce base resistance by adjusting the impurity concentration in the internal base layer higher than the concentration in the homojunction bipolar transistor.

Since the present embodiment uses the SOI substrate, it can provide a lateral heterojunction bipolar transistor with a small parasitic capacitance which is high in fmax and suitable for high-speed operation, similarly to the technology disclosed in the foregoing document.

In the structure shown in FIG. 1, the mesa single-crystal Si layer designated at 101 may also serve as the emitter, not as the collector, the polysilicon layer designated at 103 may also serve as a collector withdrawn layer, not as the emitter, and the single-crystal Si layer designated at 102b may also serve as the collector. In this case, a bipolar transistor with a particularly high breakdown voltage is obtained. In addition, the single-crystal Si region serving as the collector preferably has a lateral thickness of 0.2 μm or more and a retrograde distribution is formed more preferably, in which the concentration of Sb as the impurity increases gradually with distance from the internal base 102a to provide a higher breakdown voltage, similarly to the collector of the present embodiment.

Embodiment 2

A description will be given below to a second embodiment as a variation of the lateral heterojunction bipolar heterojunction transistor according to the first embodiment.

Figure 5:
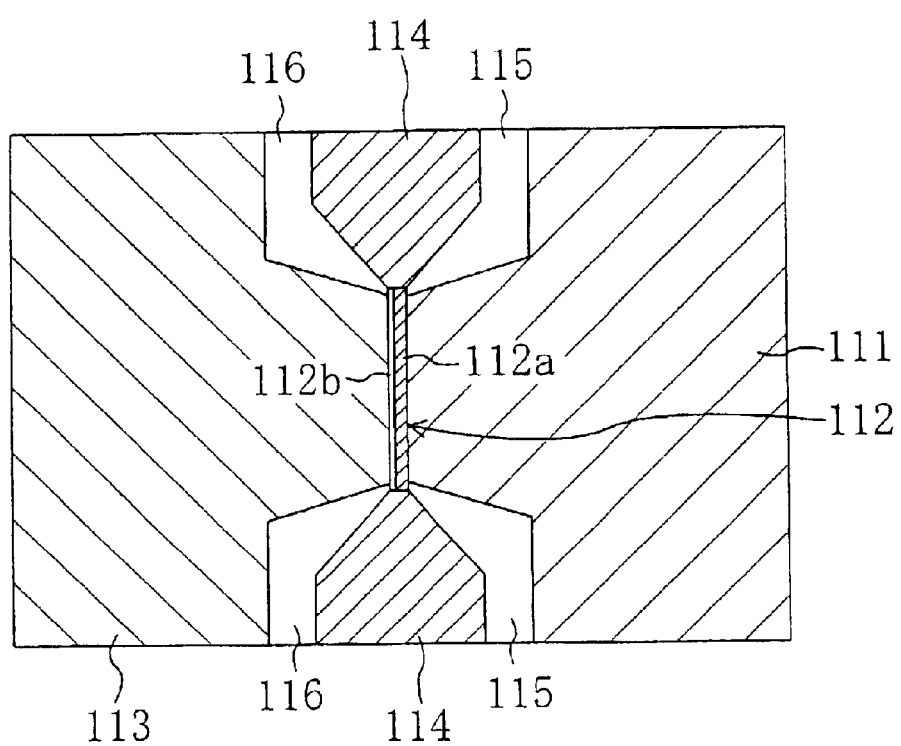
FIG. 5 is a plan view of a lateral heterojunction bipolar transistor according to a second embodiment of the present invention.

FIG. 5 is a plan view of a lateral heterojunction bipolar transistor according to the second embodiment. In the present embodiment, the structure of a portion functioning as an npn transistor is the same as in the first embodiment.

As shown in the drawings, the lateral heterojunction bipolar transistor according to the present embodiment also has a so-called SOI structure comprising: a Si substrate; a BOX layer composed of a silicon oxide film disposed on the Si substrate; and a semiconductor layer disposed on the BOX layer. In the semiconductor layer, a linear SiGeC/Si layer 112 composed of a p-type SiGeC layer and an n-type Si layer is provided. A collector 111 made of single-crystal silicon containing an n-type impurity and an emitter 113 made of polysilicon containing an n-type impurity are disposed on both sides of the SiGeC/Si layer 112. External bases 114 each composed of a polysilicon layer containing a p-type impurity is disposed on both ends of the middle straight line portion of the SiGeC/Si layer 112. Of the SiGeC/Si layer 112, the portion composed of the p-type SiGeC layer (hatched portion in the drawing) is an internal base layer 112a and the portion composed of the n-type Si layer (the blank portion in the drawing) is the emitter operating region 112b.

The collector layer 111 with a thickness of about 200 nm and sides of about 1.0 μm has been doped with antimony (which may be phosphorous or arsenic) at a concentration of about $1 \times 10^{19}$ atoms·cm$^{-3}$. The principal surface of the collector 111 is a (110) plane and each of the side surfaces thereof is a smooth (111) plane. Although the internal base 112a contains boron at a concentration of about $2 \times 10^{18}$ atoms·cm$^{-3}$ and is composed of a $Si_{1-x}Ge_xC_y$ layer having a graded composition in the present embodiment, the internal base 112a may also be composed of SiGe containing no C (such as $Si_{1-x}Ge_x$ having a graded composition). However, the presence of C contained in an extremely small amount achieves the particularly large effect of preventing the diffusion of the impurity. On the other hand, the emitter operating region 112b is made of single-crystal Si containing phosphorus (or arsenic) at a concentration of about $1\times10^{18}$ atom·cm$^{-3}$ or more. The emitter 113 is composed of n-type polysilicon containing phosphorus (or arsenic) at a concentration of about $1\times10^{20}$ atoms·cm$^{-3}$ or more. That is, a Si/SiGeC/Si heterojunction is formed among the emitter operating region, the internal base, and the collector. The external base 114 is composed of polysilicon containing boron at a concentration of about $1\times10^{20}$ atoms·cm$^{-3}$. The external base 114 functions as a contact region with the internal base 112a. The external base 114 and the collector 111 are electrically insulated from each other by a first insulating film 115. The external base 114 and the emitter 113 are electrically insulated from each other by a second insulating film 116.

The collector 111 has a retrograde structure in which the concentration of the n-type impurity (antimony) increases gradually with distance from the internal base 112a. The internal base 112a has a graded composition such that the content of Ge (or Ge and C) decreases gradually with distance from the collector 111, which increases the mobility of electrons in the internal base layer 112a. However, the retrograde structure in the collector 111 and the graded composition in the internal base 112a need not necessarily be provided.

A method of fabricating the lateral heterojunction bipolar transistor according to the present embodiment will be described briefly.

Although the lateral heterojunction bipolar transistor according to the present embodiment has a plan configuration different from that of the lateral heterojunction bipolar transistor according to the first embodiment, the basic fabrication process is the same as in the first embodiment. That is, the SOI substrate composed of the Si substrate, the BOX layer, and the Si film is formed and then the Si film is patterned to form the mesa portion of the collector 111. At this time, each of the side surfaces of the middle portion of the collector 111 can be formed to an extremely smooth (111) plane by the same process as performed in the first embodiment. Then, one of the side surfaces of the mesa portion of the collector 111 is exposed by covering the other side surfaces thereof with the first insulating film 115. Subsequently, an undoped Si layer partly composing the collector 111 is grown epitaxially on the one side surface by CVD or UHV-CVD. Then, the SiGeC layer containing 2% of C in which the content of Ge is graded is epitaxially grown on the undoped Si layer. By further forming an undoped Si layer thereafter, the SiGeC/Si layer 112 is formed. After that, a polysilicon film is deposited on the substrate, etched back, and thereby planarized. After boron ions are implanted into the portion of the polysilicon film serving as the external base 114 and phosphorus ions are implanted into the portion thereof serving as the emitter 113, the patterning of the polysilicon film and the burying of an insulator is performed, whereby the emitter 113 and the external base 114 are electrically insulated from each other by the second insulating film 116.

Thereafter, a heat treatment (annealing) for activating the implanted impurity ions is performed. By the heat treatment, an n-type impurity such as phosphorus implanted in the polysilicon of the emitter 113 is diffused into the undoped silicon of the emitter operating region 112b such that the emitter operating region 112b functions as the emitter region of the npn bipolar transistor. In the Si layer of the epitaxial layers partly composing the collector 111, antimony (Sb) is diffused from the mesa portion of the collector 111 to form a retrograde impurity concentration profile.

In the present embodiment also, the conditions for impurity implantation and the types of ions implanted in the foregoing fabrication process are the same as in the first embodiment.

Although the present embodiment achieves basically the same effects as achieved by the first embodiment, the first embodiment is advantageous over the second embodiment in that an area occupied by the entire bipolar transistor is smaller.

Embodiment 3

Figure 6A:
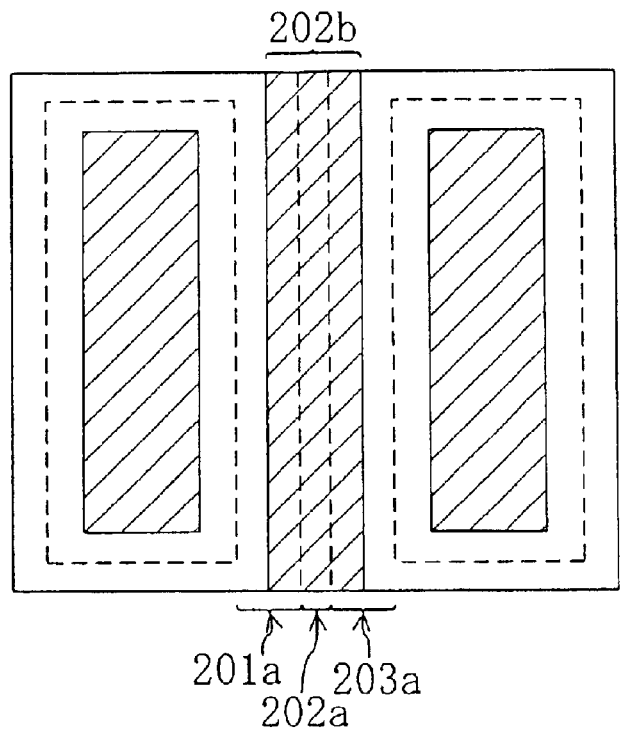
FIGS. 6(a) and 6(b) are a plan view and a cross-sectional view of a lateral heterojunction bipolar transistor according to a third embodiment of the present invention.
Figure 6B:
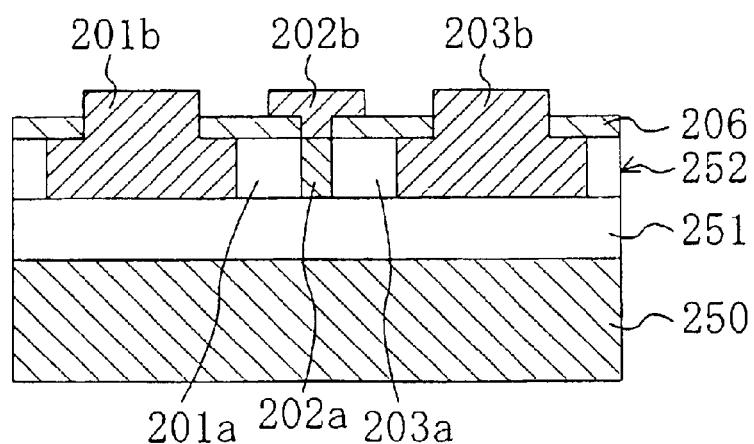

FIGS. 6(a) and 6(b) are a plan view and a cross-sectional view of a lateral heterojunction bipolar transistor according to a third embodiment of the present invention.

As shown in FIGS. 6(a) and 6(b), the lateral heterojunction bipolar transistor according to the present embodiment has a so-called SOI structure comprising: a Si substrate 250; a BOX layer 251 composed of a silicon oxide film disposed on the Si substrate 250; and a semiconductor layer 252 disposed on the BOX layer 251. In the semiconductor layer 252, an internal base layer 202a composed of a p-type SiGe layer having a linear plan configuration is provided. A collector 201a made of n-type single-crystal silicon and an emitter 203a made of n-type single-crystal silicon are disposed on both sides of the internal base layer 202a. The lateral heterojunction bipolar transistor according to the present embodiment also comprises: an oxide film 206 covering the top surface of the semiconductor layer 252; an external base layer 202b made of p-type polysilicon in contact with the internal base layer 202a through an opening in the oxide film 206; a collector contact 201b made of n-type polysilicon buried in a groove formed in the oxide film 206 and the collector 201a; and an emitter contact 203b made of n-type polysilicon buried in a groove formed in the oxide film 206 and the emitter 203a.

Although the principal surface of each of the collector 201 and the emitter 203 is a (100) plane in the present embodiment, the principal surface of each of the collector 201 and the emitter 203 may also be a (110) plane and each of the side surfaces thereof may also be a smooth (111) plane, similarly to the first and second embodiments. The collector 201 and the emitter 203 have been doped with phosphorus at a concentration of about $1\times10^{18}$ atoms·cm$^{-3}$. Although the internal base layer 202a contains boron at a concentration of about $5\times10^{18}$ atoms·cm$^{-3}$ and is composed of the SiGe layer having a composition represented by $Si_{0.7}Ge_{0.3}$ in the present embodiment, an extremely small amount (e.g., about 2%) of C may also be contained in the internal base layer 202a. However, the presence of C contained in only an extremely small amount achieves the particularly large effect of preventing the diffusion of the impurity. Each of the collector contact 201b, the emitter contact 203b, and the external base layer 202b has been doped with phosphorus at a concentration of about $1\times10^{20}$ atoms·cm$^{-3}$ or more.

Referring to FIGS. 7(a) to 7(e), a method of fabricating the lateral heterojunction bipolar transistor according to the present embodiment will be described. FIGS. 7(a) to 7(e) are cross-sectional views illustrating the process of fabricating the lateral heterojunction bipolar transistor according to the present embodiment.

Figure 7A:
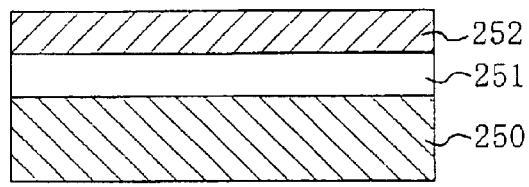
FIGS. 7(a) to 7(e) are cross-sectional views illustrating a method of fabricating the lateral heterojunction bipolar transistor according to the third embodiment.

First, in the step shown in FIG. 7(a), the SOI substrate composed of the Si substrate 250, the BOX layer 251 composed of the silicon oxide film, and the Si film (semiconductor layer) formed on the BOX layer 251 is formed. The semiconductor layer 252 has a thickness of about 200 nm and has been doped with phosphorus at a concentration of about $1\times10^{18}$ atoms·cm$^{-3}$.

Figure 7B:
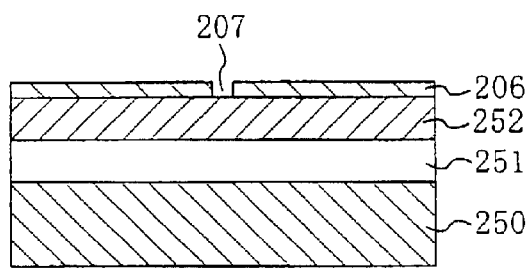
Figure 7C:
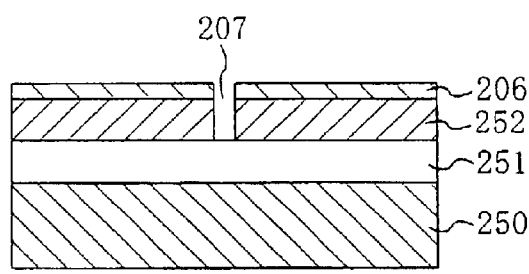

Next, in the step shown in FIG. 7(b), the oxide film 206 is formed on the semiconductor layer 252 and a slit 207 is formed in the middle portion of the oxide film 206. The slit 207 is then increased in depth to penetrate the semiconductor layer 252 in the step shown in FIG. 7(c).

Figure 7D:
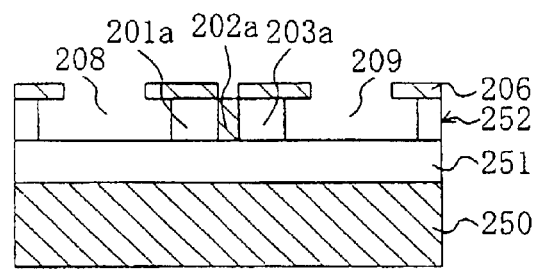

Next, in the step shown in FIG. 7(d), $Si_{0.7}Ge_{0.3}$ is epitaxially grown by CVD or UHV-CVD from both sides of the slit 207 to be united in the middle of the slit 207, thereby forming the internal base layer 202a buried in the slit 207. During the step, the internal base layer 202a is doped in situ with boron at a concentration of about $5\times10^{18}$ atoms·cm$^{-3}$. Thereafter, grooves are formed by dry etching in the regions of the oxide film 206 located on both sides of the slit and at a distance of about 200 nm therefrom. The grooves are further enlarged by wet etching to reach the semiconductor layer 252 to form grooves 208 and 209 therein. During the step, the isotropic etching action of wet etching laterally enlarges the grooves 208 and 209 till the end portion of each of the grooves 208 and 209 reaches a point at a distance of about 100 nm from the slit 207.

Figure 7E:
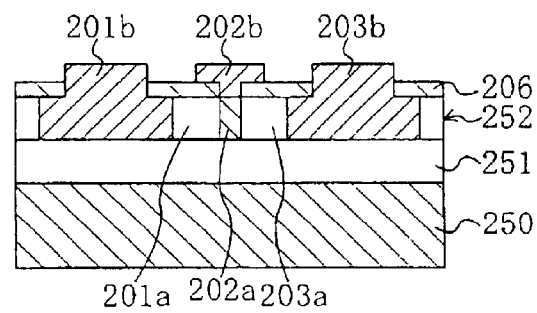

Next, in the step shown in FIG. 7(e), a metal such as aluminum is buried in the grooves 208 and 209 to form the collector contact 201b and the emitter contact 203b. After a polysilicon film heavily doped with boron is deposited on the substrate, it is patterned to form the external base layer 202b in contact with the internal base layer 202a within the slit 207.

In the lateral heterojunction bipolar transistor according to the present embodiment, the internal base layer 202a is composed of the SiGe layer formed by epitaxial growth so that a heterojunction having a relatively sharp concentration profile is formed as described above.

In addition, the internal base layer 202a and the external base layer 202b are connected to each other by self alignment in accordance with the method of the present embodiment. This reduces a parasitic resistance and reduces a parasitic capacitance particularly remarkably. Since the collector contact 201b and the emitter contact 203b can be composed of the buried metal, the parasitic resistance of each of the contacts is reduced, which allows the formation of a lateral heterojunction bipolar transistor with excellent characteristics.

Embodiment 4

Figure 8:
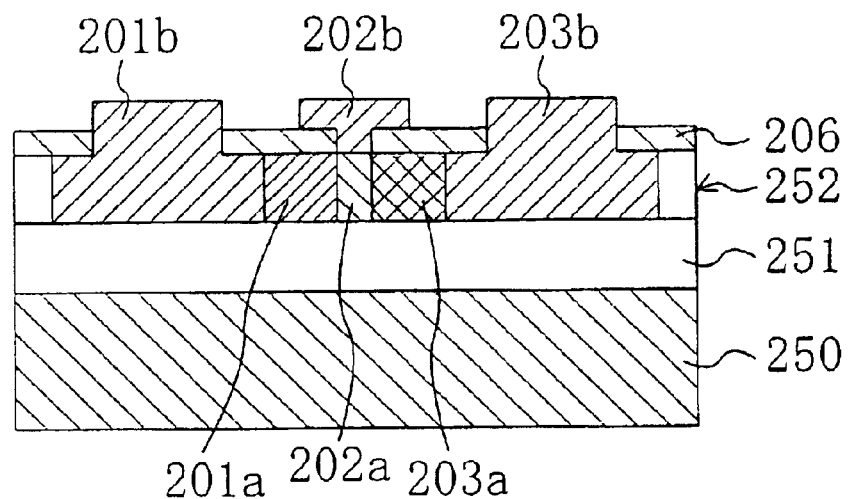
FIG. 8 is a plan view of a lateral heterojunction bipolar transistor according to a fourth embodiment of the present invention.

FIG. 8 is a plan view of a lateral heterojunction bipolar transistor according to a fourth embodiment of the present invention. The lateral heterojunction bipolar transistor of the present embodiment has basically the same plan configuration as that of the third embodiment, though the plan view thereof is not shown in the present embodiment.

As shown in FIG. 8, the lateral heterojunction bipolar transistor of the present embodiment has basically the same structure as that of the third embodiment except that the emitter 203a and the collector 201a have different impurity concentrations.

In the present embodiment, the emitter 203a is doped with antimony (Sb) at a high concentration of about $1\times10^{20}$ atoms·cm$^{-3}$ or more and the collector 201a is doped with antimony (Sb) at a relatively low concentration of about $1\times10^{17}$ atoms·cm$^{-3}$. By thus doping the emitter 203a and the collector 201a with the impurity at the respective optimum concentrations, electrons can be implanted efficiently from the emitter 203a into the collector 201a through the internal base layer 202a, which achieves the effect of implementing a high-speed and high-gain transistor operation in addition to the effects achieved by the third embodiment.

Referring to FIGS. 9(a) to 9(f), a method of fabricating the lateral heterojunction bipolar transistor according to the present embodiment will be described. FIGS. 9(a) to 9(f) are cross-sectional views illustrating the process of fabricating the lateral heterojunction bipolar transistor according to the present embodiment.

Figure 9A:
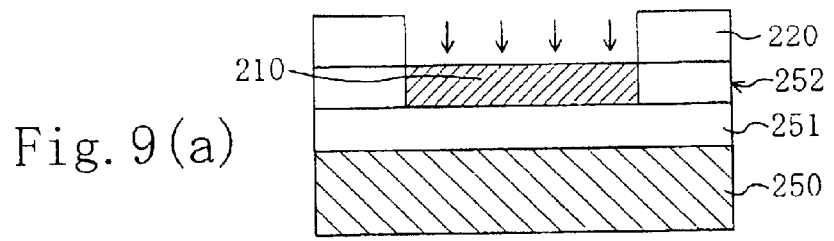
FIGS. 9(a) to 9(f) are cross-sectional views illustrating a method of fabricating the lateral heterojunction bipolar transistor according to the fourth embodiment.

First, in the step shown in FIG. 9(a), the SOI substrate composed of the Si substrate 250, the BOX layer 251 composed of the silicon oxide film, and the Si film (semiconductor layer) formed on the BOX layer 251 is formed. The semiconductor layer 252 has a thickness of about 200 nm. Then, a resist mask 220 having an opening wider than a combined region of an emitter formation region and a collector formation region is formed on the semiconductor layer 252. Subsequently, antimony (Sb) ions are implanted into the semiconductor layer 252 from above the resist mask 220 under such conditions that the concentration of antimony in the semiconductor layer 252 is about $1\times10^{17}$ atoms·cm$^{-3}$. By the step, a low-concentration impurity implanted region 210 which is to serve as a collector later and a high-concentration impurity implanted region 211 which is to serve as an emitter are formed in the semiconductor layer 252.

Figure 9B:
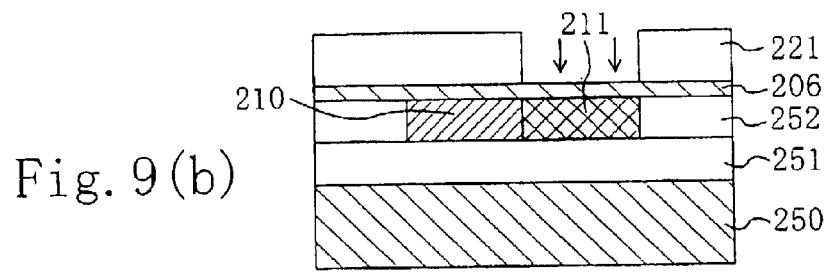

Next, in the step shown in FIG. 9(b), the oxide film 206 is formed on the semiconductor layer 252. Then, a resist mask 221 having an opening including the emitter formation region of the region into which antimony ions have been implanted and overlapping a region in which a slit for base formation is to be formed is formed on the oxide film 206. Subsequently, antimony ions (Sb) are implanted into the semiconductor layer 252 from above the resist mask 221 under such conditions that the concentration of antimony in the semiconductor layer 252 is $1\times10^{20}$ atoms·cm$^{-3}$.

Figure 9C:
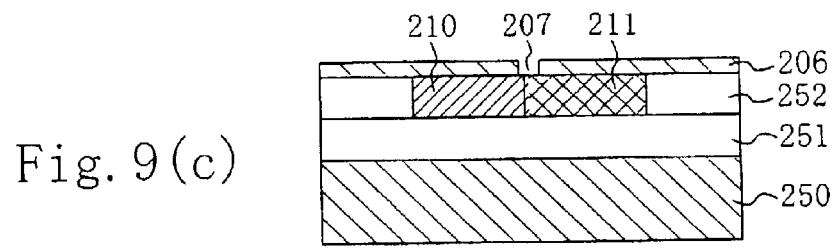
Figure 9D:
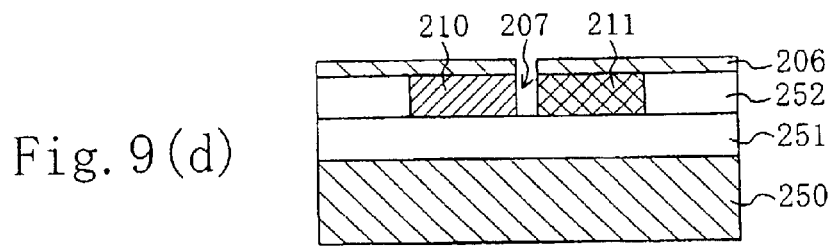

Then, in the step shown in FIG. 9(c), a slit 207 is formed in the middle portion of the oxide film 206. The slit is then increased in depth to penetrate the semiconductor layer 252 in the step shown in FIG. 9(d).

Figure 9E:
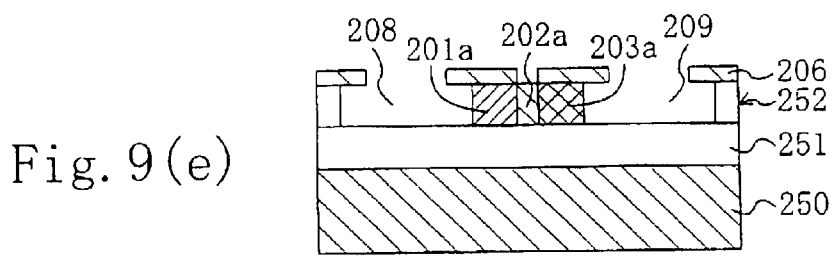

Next, in the step shown in FIG. 9(e), $Si_{0.7}Ge_{0.3}$ is epitaxially grown by CVD or UHV-CVD from both sides of the slit 207 to be united in the middle of the slit 207, thereby forming the internal base layer 202a buried in the slit 207. During the step, the internal base layer 202a is doped in situ with boron at a concentration of about $5\times10^{18}$ atoms·cm$^{-3}$. Thereafter, grooves are formed by dry etching in the regions of the oxide film 206 located on both sides of the slit and at a distance of about 200 nm therefrom. The grooves are further enlarged by wet etching such that one of the grooves reaches the semiconductor layer 252 and the low-concentration impurity implanted region 210 to form a groove 208 therein and the other of the grooves reaches the semiconductor layer 252 and the high-concentration impurity implanted region grooves 211 to form a groove 209 therein. During the step, the isotropic etching action of wet etching laterally enlarges the grooves 208 and 209 till the end portion of each of the grooves 208 and 209 reaches a point at a distance of about 100 nm from the slit 207.

Figure 9F:
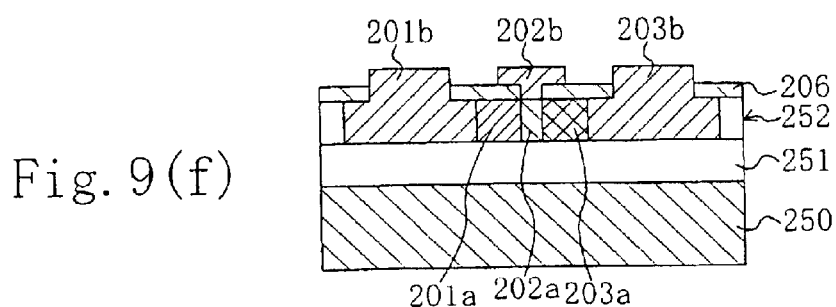
Figure 10A:
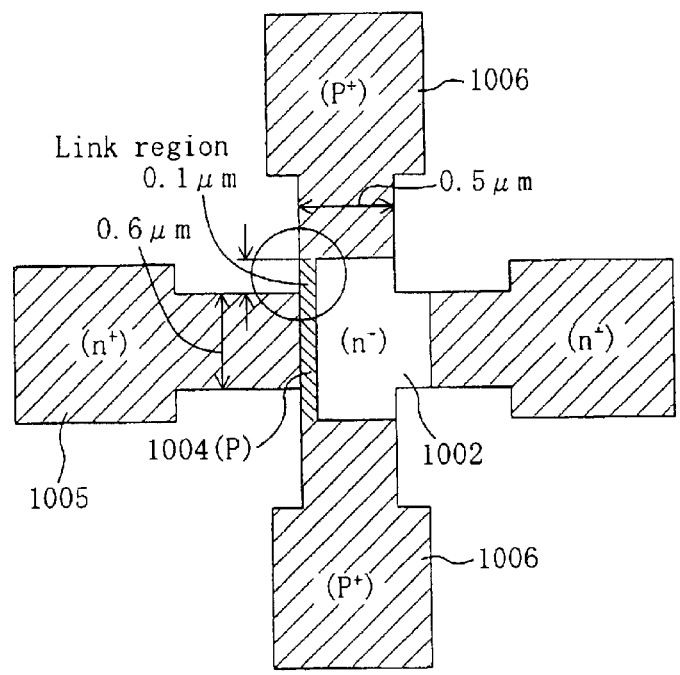
FIGS. 10(a) and 10(b) are a plan view and a cross-sectional view of a conventional lateral heterojunction bipolar transistor disclosed in the document.
Figure 10B:
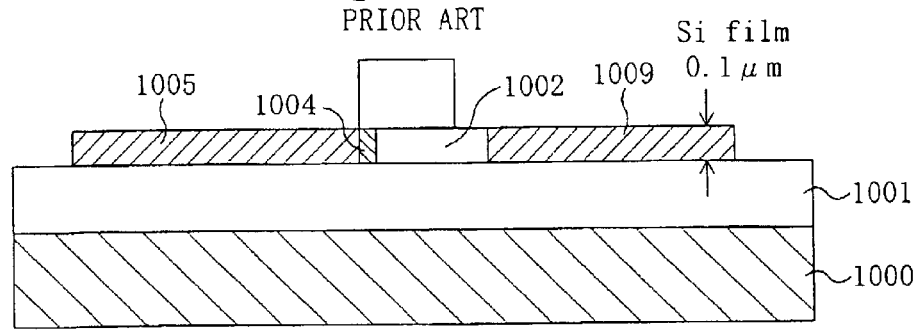
Figure 11A:
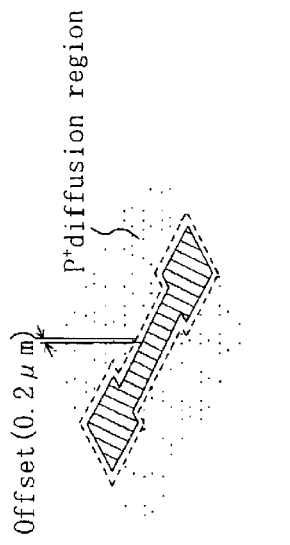
FIGS. 11(a) to 11(e) are cross-sectional views illustrating a method of fabricating the conventional lateral heterojunction bipolar transistor.
Figure 11B:
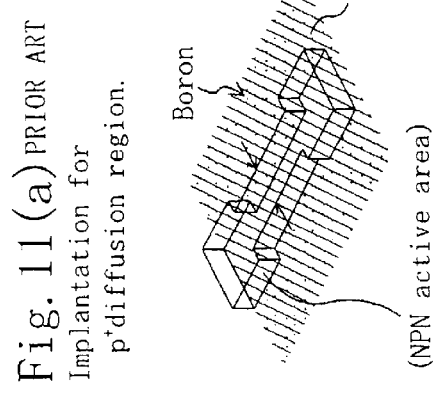
Figure 11D:
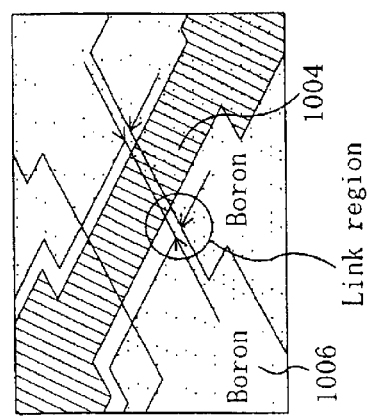
Figure 11C:
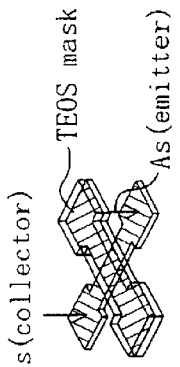
Figure 11E:
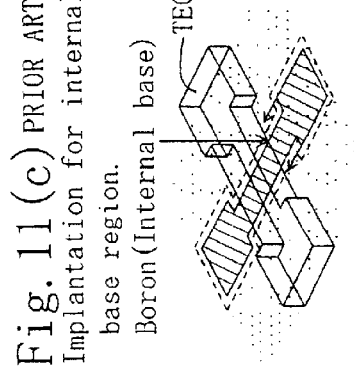

Next, in the step shown in FIG. 9(f), a metal such as aluminum is buried in the grooves 208 and 209 to form the collector contact 201b and the emitter contact 203b. After a polysilicon film heavily doped with boron is deposited on the substrate, it is patterned to form the external base layer 202b in contact with the internal base layer 202a within the slit 207.

In the lateral heterojunction bipolar transistor according to the present embodiment, the impurity concentrations in the emitter 203a and the collector 201a can be adjusted to be more suitable for the operation of the bipolar transistor. This achieves the effect of providing, by simple process steps, an impurity concentration profile in which the emitter 203a and the collector 201a have different concentrations in addition to the effects achieved by the third embodiment.

What is claimed is:

1. A method of fabricating a lateral heterojunction bipolar transistor, the method comprising the steps of:
    (a) forming an etching mask on a semiconductor layer disposed on an insulating layer to compose a substrate;
    (b) patterning the semiconductor layer by etching including dry etching and using the etching mask to form a first semiconductor layer in a mesa configuration;
    (c) epitaxially growing, on at least one side surface of the first semiconductor layer, a second semiconductor layer having a band gap different from a band gap of the first semiconductor layer; and
    (d) epitaxially growing, on a side surface of the second semiconductor layer, a third semiconductor layer having a band gap different from the band gap of the second semiconductor layer,
    at least the first semiconductor layer functioning as a 5 collector of a first conductivity type, at least a part of the second semiconductor layer functioning as an internal base layer of a second conductivity type, at least a part of the third semiconductor layer functioning as an emitter operating region of the first conductivity type.

2. The method of claim 1, wherein the step (b) includes:
    patterning the semiconductor layer by dry etching into a configuration of the etching mask and;
    forming the first semiconductor layer by performing wet etching with respect to a side portion of the patterned semiconductor layer, while leaving the etching mask.

3. The method of claim 1, further comprising, after the step (d), the steps of:
    (e) depositing a polycrystalline semiconductor film on the substrate; and
    (f) planarizing the polycrystalline semiconductor film by CMP to form an emitter in contact with at least the third semiconductor layer.

4. The method of claim 1, further comprising, in or after the step (e), the step of:
    introducing an impurity of the first conductivity type into a first region of the polycrystalline semiconductor film and introducing an impurity of the second conductivity type into a second region of the polycrystalline semiconductor film; and
    removing, of the polycrystalline semiconductor film, at least a portion located between the first and second regions to form an emitter in contact with the third semiconductor layer from the first region and form an external base layer in contact with the second semiconductor layer from the second region.

5. The method of claim 4, wherein the introduction of the impurity is performed by ion implantation using a mask.

6. The method of claim 4, wherein the step (g) is performed by wet etching.

7. The method of claim 1, wherein the etching mask is formed by using a semiconductor layer having a principal surface of a {110} plane as the semiconductor layer on the insulating layer in the step (a) and such that the side surface of the first semiconductor layer in contact with the second semiconductor layer is a {111} plane in the step (b).

8. The method of claim 1, wherein the step (b) includes:
    crystal anisotropic etching using an etching solution containing at least any one of ethylenediamine, pyrocatechol, KOH, and hydrazine.

9. A method of fabricating a lateral heterojunction bipolar transistor, the method comprising the steps of:
    (a) introducing an impurity of a first conductivity type into a first semiconductor layer containing an impurity of the first conductivity type, the first semiconductor layer being disposed on an insulating layer to compose a substrate;
    (b) forming, on the first semiconductor layer, an etching mask having a slit with a width of 200 nm or less;
    (c) removing a portion of the semiconductor layer located under the slit by etching using the etching mask to form a groove penetrating the first semiconductor layer;
    (d) epitaxially growing, from both side surfaces of the groove in the first semiconductor layer, a second semiconductor layer having a band gap different from a band gap of the first semiconductor layer such that the second semiconductor layer is buried in the groove;
    (e) forming openings in respective regions of the insulating layer located on both sides of the slit and above the first semiconductor layer;
    (f) performing wet etching with respect to the first semiconductor layer from the openings in the insulating layer to form hollow portions and leave respective portions of the first semiconductor layer on both sides of the second semiconductor layer;
    (g) forming first and second electrodes to be buried in the respective hollow portions; and
    (h) forming a third electrode to be buried in the slit in the insulating film in contact relation with the second semiconductor layer,
    the respective portions of the first semiconductor layer left on both sides of the second semiconductor layer functioning as a collector and an emitter operating region, the second semiconductor layer functioning as an internal base layer.

10. The method of claim 9, wherein the step (f) includes:
    crystal anisotropic etching using at least any one of ethylenediamine, pyrocatechol, KOH, and hydrazine.

11. The method of claim 9, wherein
    the step (a) includes a first ion implantation for implanting impurity ions of the first conductivity into the first semiconductor layer and a second ion implantation for implanting, into a portion of the first semiconductor layer, the impurity ions at a concentration higher than in the first ion implantation,
    the collector is formed from a portion of the first semiconductor layer with respect to which only the first ion implantation has been performed and the second ion implantation has not been performed, and
    the emitter operating region is formed from the portion of the first semiconductor layer with respect to which the first and second ion implantations have been performed.

12. The method of claim 9, wherein
    a silicon layer is used as the first semiconductor layer and
    an alloy containing at least any two of Si, Ge, and C is used as the second semiconductor layer.

* * * * *